US009215814B2

(12) United States Patent
Blakemore et al.

(10) Patent No.: US 9,215,814 B2
(45) Date of Patent: Dec. 15, 2015

(54) ELECTRONICS ASSEMBLY DIVIDER PLATE

(75) Inventors: Scott A. Blakemore, Warrenville, IL (US); Andrew M. Franczek, Romeoville, IL (US); Zongxian Duan, Shanghai (CN); Qingzhen Ba, Shangha (CN)

(73) Assignee: Coriant Operations, Inc., Naperville, IL (US)

( * ) Notice: Subject to any disclaimer, the term of this patent is extended or adjusted under 35 U.S.C. 154(b) by 221 days.

(21) Appl. No.: 13/336,622

(22) Filed: Dec. 23, 2011

(65) Prior Publication Data
US 2013/0163209 A1 Jun. 27, 2013

(51) Int. Cl.
*H05K 1/14* (2006.01)
*H05K 3/30* (2006.01)

(52) U.S. Cl.
CPC ...... *H05K 3/301* (2013.01); *H05K 2201/10189* (2013.01); *H05K 2201/10537* (2013.01); *Y10T 29/49147* (2015.01)

(58) Field of Classification Search
CPC .......... H05K 2201/10189; H05K 2201/10537; H05K 3/301
USPC ......... 361/827, 828, 825, 730, 790, 797, 800, 361/826, 736, 807–810; 174/72 A; 211/26, 211/41.17; 439/79; 29/842
See application file for complete search history.

(56) References Cited

U.S. PATENT DOCUMENTS

| | | | |
|---|---|---|---|
| 6,537,106 B1* | 3/2003 | Follingstad | 439/534 |
| 7,916,502 B2* | 3/2011 | Papakos et al. | 361/826 |
| 8,520,408 B2* | 8/2013 | Hruby et al. | 361/827 |
| 2005/0094378 A1* | 5/2005 | Moulton et al. | 361/704 |
| 2008/0248661 A1* | 10/2008 | Costello | 439/79 |
| 2009/0023309 A1* | 1/2009 | Knapp et al. | 439/65 |
| 2010/0060476 A1* | 3/2010 | Yajima et al. | 340/815.65 |

* cited by examiner

*Primary Examiner* — Yuriy Semenenko
(74) *Attorney, Agent, or Firm* — Hamilton, Brook, Smith & Reynolds, P.C.

(57) ABSTRACT

Small form-factor pluggable (SFP) ports are often employed in telecommunications hardware to take advantage of their lower profile and to provide connections to other network elements. The use of SFP ports has increased the density of ports possible for a given circuit board size, but this increase has previously meant that individual ports are difficult to access. Also, identification of those ports is frustrated by a lack of free space to place labeling. Example embodiments of the present invention address these issues by placing a divider plate between columns of SFP ports that provides surface area adjacent to the SFP ports for affixing labeling. The divider plate is offset from the SFP ports to allow access when the plate is installed. As a result, hardware employing embodiments of the present invention can achieve a higher density of SFP ports with ease of access by personnel assembling or servicing the hardware.

11 Claims, 7 Drawing Sheets

ELECTRONICS ASSEMBLY DIVIDER PLATE

BACKGROUND OF THE INVENTION

Most industrial telecommunications hardware is housed in standardized equipment racks that contain individual circuit board components. These circuit boards can perform a myriad of high-bandwidth operations and require high speed connections to other hardware elements or the network that they are serving. To provide these connections, small form factor ports are often employed in telecommunications hardware; the ports provide for optical or electromagnetic connections to be made between various hardware components or other communication lines by accepting a standardized plug at the end of an optical or copper wire to be inserted and form a connection to the attached hardware. Small form factor ports are typically configured in rows or columns to take advantage of their lower profile compared to other legacy methods of interconnection and can drastically increase the density of physical interconnections possible for a given circuit board size.

SUMMARY OF THE INVENTION

An example embodiment of the present invention is a small form factor pluggable (SFP) module including a plurality of SFP ports arranged in adjacent columns on a circuit board of the SFP module. The SFP module also includes a divider plate attached in parallel arrangement with the SFP module and, optionally, adjacent to the SFP ports, spanning at least the length of the columns of the ports along the SFP module. The divider plate is offset from the adjacent SFP ports in a manner that creates a gap between the divider plate and the SFP ports and in-plane with the module itself.

Another example embodiment of the present invention includes an electronics assembly that includes a circuit board, a front panel frame assembly, a plurality of SFP ports, and a divider plate. The circuit board is configured to communicate electrical signals between the SFP ports and a communications network. The circuit board is attached to a front panel frame assembly that spans the length of the circuit board, and the front panel frame assembly is configured to mount the circuit board in an equipment rack. The example embodiment further includes a divider plate coupled to the circuit board or front panel frame assembly in an arrangement adjacent to the SFP ports, spanning at least the length of the columns of the SFP ports. The divider plate is offset from the SFP ports in an arrangement that defines a gap in the plane of the electronics assembly.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

Figure 1:
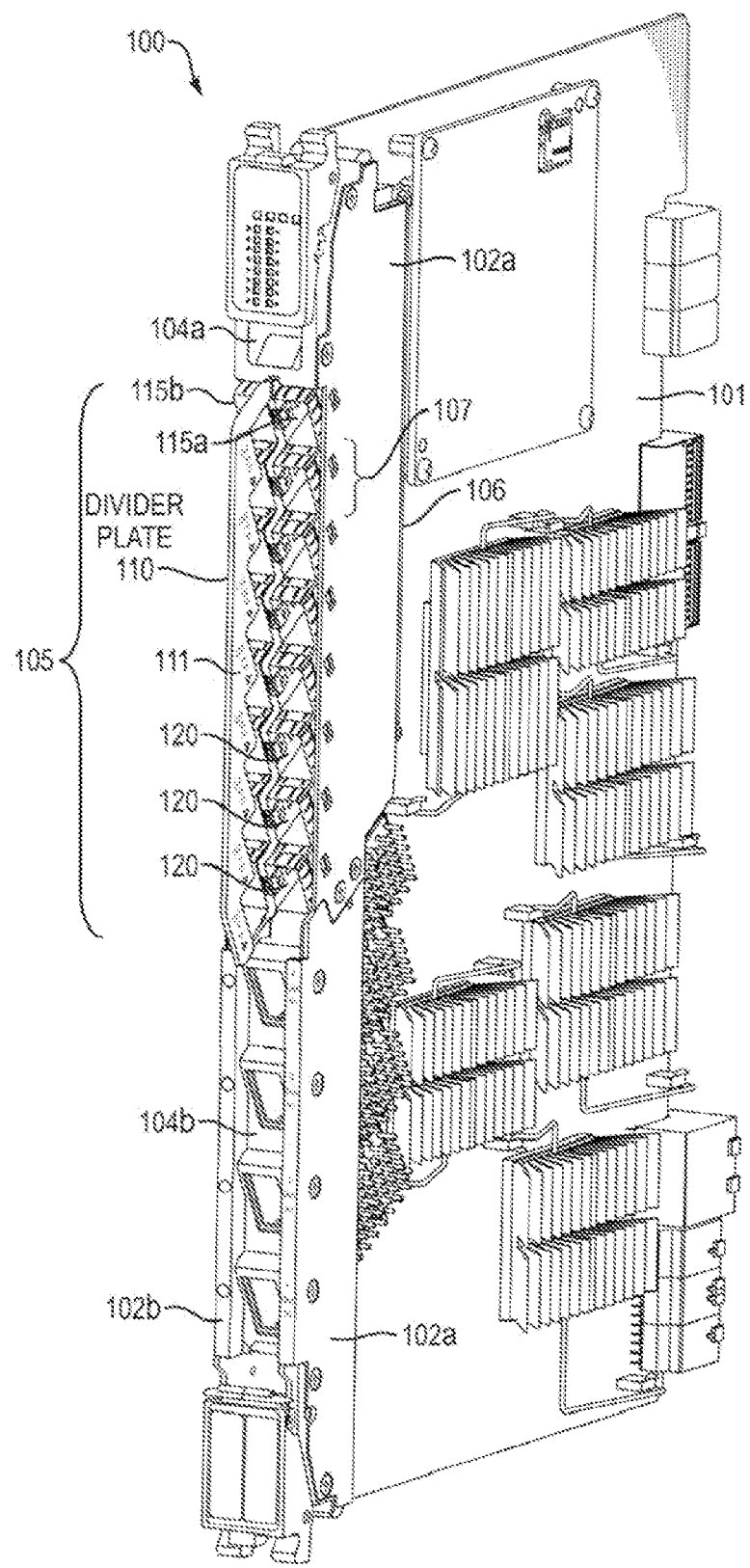
FIG. 1 is an isometric diagram of an electronics assembly with a small form factor pluggable (SFP) module and divider plate, according to an example embodiment of the present invention that illustrates the divider plate in an installed configuration.

A description of example embodiments of the invention follows.

Telecommunications and data communications hardware is commonly housed in modular racks that provide a standardized form-factor to which various hardware components are connected. These hardware components form the backbone of the world's communications networks and enable a high volume of high-bandwidth connections to be made through fiber optic or electromagnetic cables connecting to other components or external communications lines. The complexity of these systems and the constant growth of processing power require that individual components have an increasing number of input and output connections. Various standards of high-bandwidth connections have been developed over the years, with a trend towards smaller and higher density ports to reduce the overall physical size of the component systems.

One such example of this progress is the development of the small form-factor pluggable (SFP) transceiver. The SFP transceiver was debuted in 2001 as a replacement for the larger form-factor gigabit interface converter (GBIC). Both standards are hot-pluggable and support gigabit Ethernet and fiber channel communications, and, though the SFP has recently been developed to support higher speeds than the GBIC standard, the original purpose and appeal of the newer standard was the smaller size, which allows more ports to be included on a given size hardware component. As a result of this possible increase in port density, components can employ multiple rows or columns of ports in a space where such a configuration would not previously be possible. This increase in port density leads to some less-than-desirable consequences when components are installed in a complex system with a multitude of other components; individual ports are difficult to access without disturbing the surrounding connections, and identification of the ports is frustrated by a lack of free surface area to place the marking required to describe their order and direction of data flow.

Previous techniques have been proposed or implemented for providing the proper identification and ease-of-access. In one such example of a previous technique, the SFP ports are placed farther away from each other to allow sufficient space to identify them and prevent disturbance of the surrounding ports. Such techniques are simple to employ, but cost valuable space, do not scale with the size of the port, and prevent a high port density solution for a limited space application.

The example embodiments disclosed herein provide an apparatus for and method of configuring communications ports with a divider plate that provides surface area for identification of the adjacent ports and assists in the insertion and removal of the corresponding plugs so as not to disturb neighboring ports. These example embodiments allow adjacent ports to be positioned closer together and increase the overall port density of the parent component. The example embodiments disclosed have a unique design with aesthetic value in addition to a useful value.

FIG. 1 is an isometric diagram of an electronics assembly 100 with a small form factor pluggable (SFP) module 105 and divider plate 110, illustrating an example embodiment of the present invention. In the illustrated example embodiment of the present invention, the SFP module 105 includes a plurality of SFP transceivers 107, each having SFP ports 120, arranged in adjacent columns 115a-b, sometimes referred to as a "belly-to-belly" configuration, on a SFP module circuit board 106 (206 in FIGS. 2 and 406 in FIG. 4) of the SFP module 105. The SFP module 105 also includes a divider plate 110 positioned parallel to the SFP circuit board 106 and adjacent to the SFP ports 120, spanning at least the length of the columns 115a and 115b of the SFP ports 120 along the SFP module 105. Additionally, the divider plate 110 is offset from the adjacent SFP ports 120 in a manner that creates a gap between the divider plate 110 and the SFP ports 120 and in-plane with the SFP module circuit board 106. It should be understood that the divider plate 110 may be in an offset parallel arrangement from the SFP module 105, such as a few tenths of an inch or an inch, or anywhere in-between depending on the relative placements of the adjacent columns 115a and 115b of SFP ports 120.

In the example embodiment of the invention shown in FIG. 1, the electronics assembly 100 includes front panel frame assembly 102a and 102b spanning its length with the divider plate 110 coupled to the front panel frame assembly 102a and 102b. Here, the front panel frame assembly 102a covers the SFP module 105, and SFP module circuit board 106.

Another example embodiment of the present invention includes an electronics assembly 100 that includes a circuit board 101, a front panel frame assembly 102a and 102b, a plurality of SFP ports 120, and a divider plate 110. In this example embodiment, the circuit board 101 is configured to communicate electrical signals between the SFP ports 120 and a communications network (not shown). The circuit board 101 is attached to a front panel frame assembly 102a and 102b that spans the length of the circuit board 101 and is configured to mount the circuit board in a modular equipment rack. The example embodiment further includes the divider plate 110 coupled to the circuit board 101 or front panel frame assembly 102a and 102b, adjacent to the SFP ports 120 where the divider plate 110 spans at least the length of the columns 115a and 115b of the SFP ports 120 and offset from the SFP ports 120 in a manner that defines a gap in the plane (or parallel to the plate) of the electronics assembly 100. Side panels 104a and 104b can be present in this example embodiment, which can be used to secure the divider plate 110 between the front panel frame assembly 102a and 102b when in an installed configuration.

Alternatively, the divider plate 110 can be configured to be part of the SFP module circuit board 106 or the main circuit board 101. Illustrated in this example embodiment of the present invention, the columns 115a and 115b of SFP ports 120 are arranged in their narrowest possible orientation, such that oblong sides of the SFP ports 120 face each other. Additionally, shown in this example embodiment of the invention, the divider plate 110 can be positioned between columns 115a and 115b of SFP ports 120, and the columns 115a and 115b of SFP ports 120 can be configured to have a pitch between an SFP port 120 in the first column 115a to an SFP port 120 in the adjacent column 115b that is less than or equal to 1.05 inches, as measured from the center of each port. Other distances, such as 1.00 inches, 0.95 inches, and distances below or above the center of each SFP port 120, as a function of the SFP port 120 size, electronics assembly circuit board 101 thickness, SFP module circuit board 106 thickness, and/or other factors are also contemplated within the scope of the invention.

In another example embodiment of the present invention, the divider plate 110 can include at least one surface 111 configured to receive labeling, printed or adhesively attached, optionally identifying the number and data direction of the ports. Furthermore, the divider plate 110 can form the aforementioned gap between itself and the SFP ports with a repeating shape at the periphery of the divider plate, the shape, individually and as a whole, associated with the outline of the SFP ports 120 on the SFP module 105.

In the example embodiment of the present invention, the shape and placement of divider plate 110 is functional; these features assist in the connecting and disconnecting of SFP plugs (not shown). The gap formed between the divider plate 110 and columns 115a and 115b of SFP ports 120 (specifically between 308 and 309 in FIG. 3) gives a technician full access to all sides of the individual SFP ports 120 and makes the divider plate 110 less obtrusive to the technician when connecting and disconnecting a SFP plug (not shown). The placement of the divider plate 110 allows a technician to avoid touching the surrounding neighboring SFP plugs (not shown) when connecting or disconnecting an SFP plug (not shown). In the example embodiment of the present invention, the surface of divider plate 101 is also functional; the divider plate 110 provides surface area 111 for labels (211, as shown in FIG. 2) to be placed in the immediate vicinity of the SFP ports 120 without reducing the density of the SFP ports 120 on the SFP module 105.

Figures 2A, 2B:
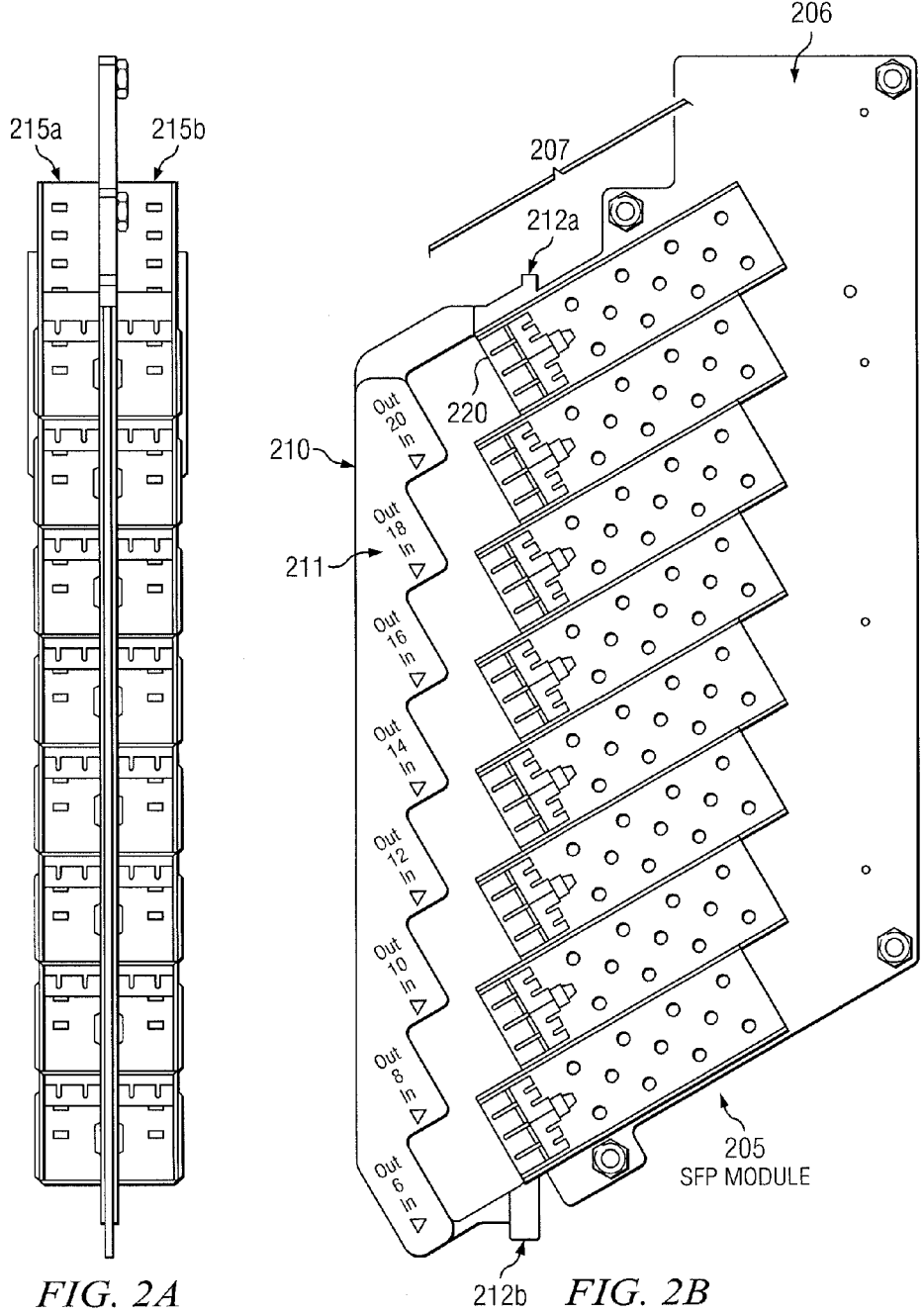
FIGS. 2A and B are diagrams of an embodiment of the present invention that illustrates a divider plate coupled to a small form factor pluggable (SFP) module.

FIGS. 2A and 2B are diagrams of an embodiment of the present invention that illustrates a divider plate 210 coupled to a small form factor pluggable (SFP) module 205. The example embodiment of FIGS. 2A and 2B illustrate a divider plate 210 in its installed position with an SFP module 205.

Referring first to FIG. 2A, FIG. 2A shows the divider plate 211 sandwiched between two columns 215a and 215b of SFP ports 120, positioned the width of the divider plate 210 (shown as 314 in FIG. 3) apart from each other. FIG. 2A further shows the density of the SFP ports 220 in general, and in particular the spacing between the SFP columns 215a and 215b, which are separated by divider plate 210. The location and dimensions of the divider plate 210 ensures that a technician can access each individual SFP port 220 for installation and/or removal of a SFP plug (not shown), while at the same time greatly increasing the port density of the electronics assembly 200 relative to legacy hardware.

The example embodiment shown in FIG. 2B further includes labels 211 affixed to the divider plate 210 identifying the number and data direction of the adjacent SFP ports 220. In another example embodiment shown in FIG. 2B, the divider plate 210 is coupled to the electronic assembly (100 in FIG. 1) by securing tabs 212a and 212b behind side panels (shown in FIG. 1 as 104a and 104b). In the alternative, the divider plate 210 is coupled to the SFP module 205 or any other component of the electronic assembly secured by tabs 212a and 212b or directly with fasteners (not shown).

SFP plugs (not shown) are modular connectors, designed and constructed to standardized parameters, enabling the connectors to be used in any SFP port 220, i.e., the SFP plug connectors are hot-pluggable and can be swapped or exchanged without shutting down the equipment to which the connectors connect. The cables (not shown) connecting various SFP ports 220 may need to be changed for a variety of reasons, such as network equipment updates, new equipment installation, or replacement of a failed cable. Modular connectors facilitate the rewiring of circuit paths between different elements of a network circuit by allowing the SFP plugs to be swapped or exchanged, rather than hardwired, which requires soldering or other technique to change a connection. Such equipment updates, installations, or replacements are made possible, in large part, by the modular character of their respective connectors, such as SFP plugs.

Typically, SFP plugs (not shown) have one or more latching tabs located along one of the two oblong sides of the connector. Latching tabs are useful to ensure that an adequate physical connection exists between the cable and the circuit board circuitry. Such an adequate physical connection is required so that an optical or electromagnetic signal with a signal-to-noise ratio (SNR) within system tolerances can propagate from the cable to the electronic assembly, or vice versa, via the SFP port 220 and electronics assembly circuit board (101, shown in FIG. 1). To ensure the integrity of a cable and the optical or electromagnetic signal which it carries, a bend radius falling within the specified limits for the SFP plug terminated cables must be observed. The bend radius of most optical and/or electromagnetic cables must be within certain limits; otherwise, the physical properties of the cables that allow for signal propagation can break down, resulting in compromised signal integrity, including such characteristics as SNR.

It is useful that technicians be able to install and uninstall individual cable connections without disturbing other neighboring connections. Such a configuration that allows for a technician to access freely the modular connections is useful because it reduces the risk of damaging neighboring connectors. To install and uninstall the SFP connectors, the oblong sides of the connectors are typically held between an index finger and thumb, so that the latching tab can be pressed against the body of the SFP plug, preventing the tab from latching onto the SFP port 220. An example embodiment of the present invention is useful because it allows for sufficient spacing between SFP ports 220 so that a technician can install or uninstall a single SFP plug, ensuring that neighboring connectors are not damaged. Providing sufficient spacing for the technician to access the SFP ports 220 helps prevent the likelihood that the technician will put physical stress on other SFP cable connections that remains installed while he or she is manipulating the target connection. Providing sufficient spacing to access freely the SFP ports 220 also obviates the need for a technician to uninstall neighboring SFP plugs for the sole purpose of avoiding applying unintended physical stress to them and thus reduces the risk that the connectors may be re-installed incorrectly. Cables connected to SFP ports 220 with sufficient spacing suffer less wear and tear because the technician is not unplugging and plugging SFP plugs for the sole reason of reaching the target SFP port 220, and therefore, less damage, which extends their useful life.

In general, three operations are completed by a network technician when a SFP port 220 connection needs replacement or alteration. An example embodiment of the present invention is useful in all of these typical operations. Whether a SFP port 220 connection needs to be changed because of an equipment upgrade, installation of new equipment, or replacement of cables, a technician must first identify the target SFP port 220 connector. Next, the technician typically unplugs the existing connection from the identified target SFP port 220. Finally, the technician installs the new SFP plug, completing the new circuit. Because the divider plate 210 provides an area for labels 211, it can facilitate identification of the target SFP port 220. Moreover, because the divider plate 210 ensures adequate space between the SFP columns 215a and 215b, and, therefore, adequate density of the SFP ports 220, it facilitates a technician's unencumbered access to connections at the SFP ports 220.

Figure 3A:
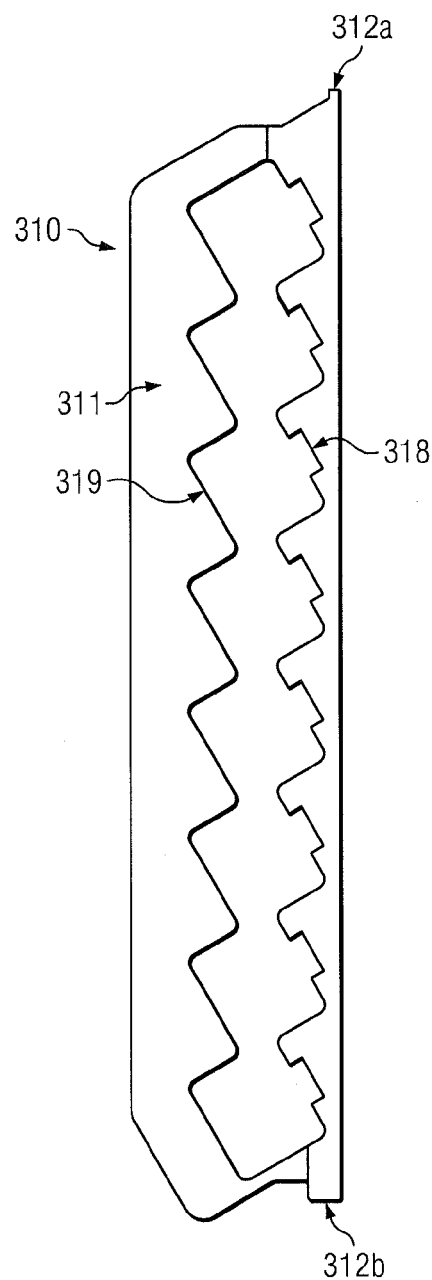
FIGS. 3A and B are diagrams of a divider plate, according to an example embodiment of the present invention.
Figure 3B:

FIGS. 3A and 3B are diagrams of a divider plate 310, according to an example embodiment of the present invention.

FIG. 3A shows the face of the divider plate 310, where the shape of the inside cutout (or formed shape) 318 outlines the shape of the SFP ports (220 in FIG. 2) so as to not protrude beyond the ports when installed, and the shape of the outside cutout 319 is similarly formed to have the shape of the profile of the adjacent SFP ports (220 in FIG. 2) to aid in the placement of labels on an exposed surface 311. FIG. 3B shows the thickness of the exposed divider plate 313 and the section 314 made to split-fit between the columns of SFP ports (215a-b in FIG. 2A).

As discussed previously and as illustrated in FIGS. 3A and 3B, the divider plate 310 provides a surface area, or "real estate," to accommodate labels (211, as shown in FIG. 2) to identify the individual SFP ports 220. Such identification of individual SFP ports 220 can be useful. When a technician replaces or reroutes a network connection from one SFP port 220 to another SFP port 220, he or she must first identify the target SFP ports 220. Identifying the target SFP ports 220 can be very difficult if the ports are not clearly labeled in a logical manner, because there are often hundreds, or more, of identical-looking SPF ports (220, as shown in FIG. 2) located in the equipment racks that form the backbone of the world's communications networks. The divider plate 310 provides surface area 311 to accommodate a variety of labels for each SPF port 220. Such labels can include the example embodiment shown in FIG. 2B of labeling 211 or the example embodiment in FIG. 5 of labeling 511, while other example embodiments of labeling can include traditional barcodes, e.g., SPARQCodes®, or any other optical machine-readable label. (SPARQCode is a registered trademark of MSKYNET, Inc., 3305 115th Ave. Ne #303, Bellevue, Wash. 98004.)

Figure 4A:
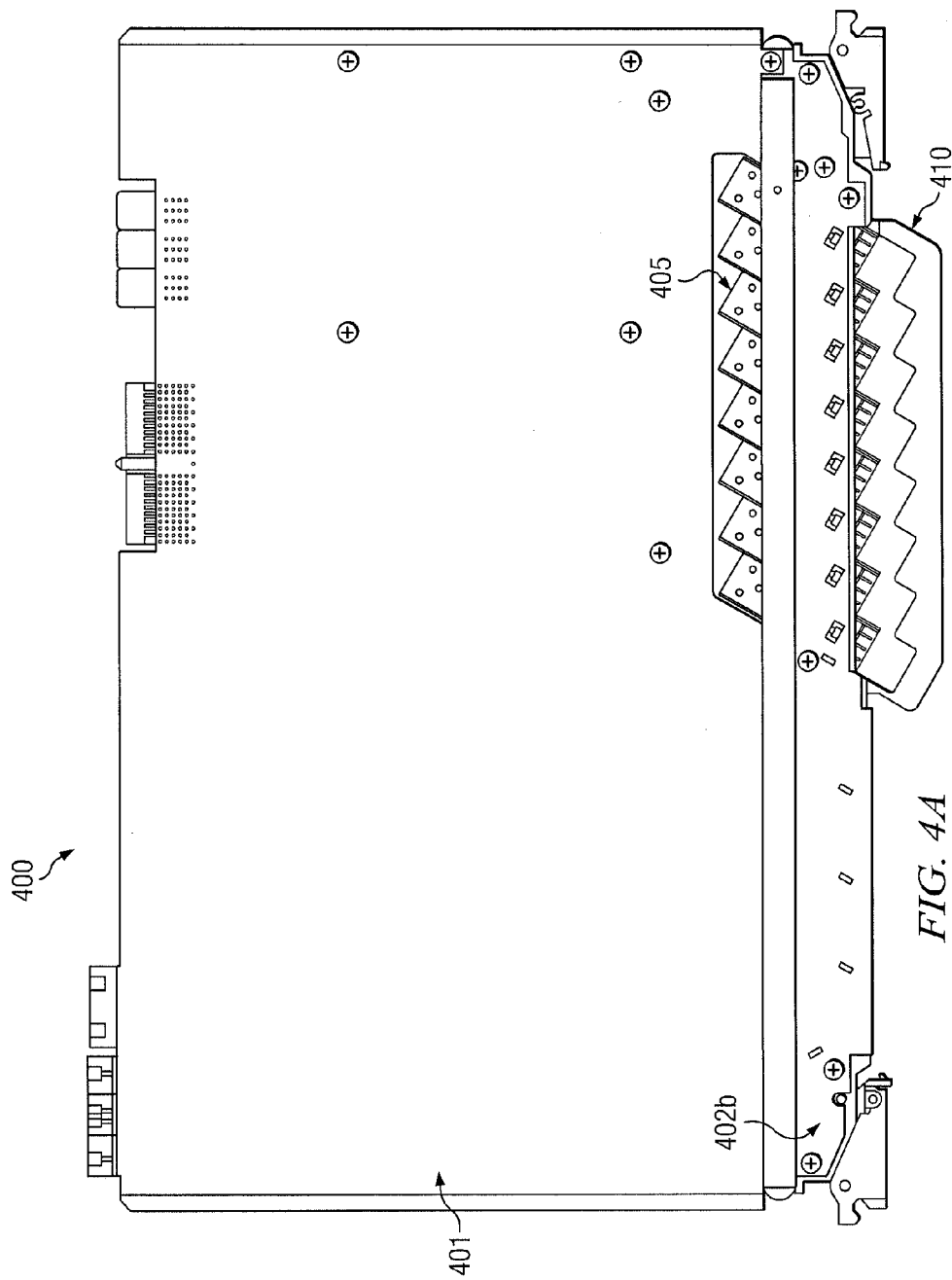
FIGS. 4A, B, and C are diagrams of an example embodiment of the present invention that illustrates a SFP module and divider plated installed on a circuit board with a front panel frame assembly.
Figure 4B:
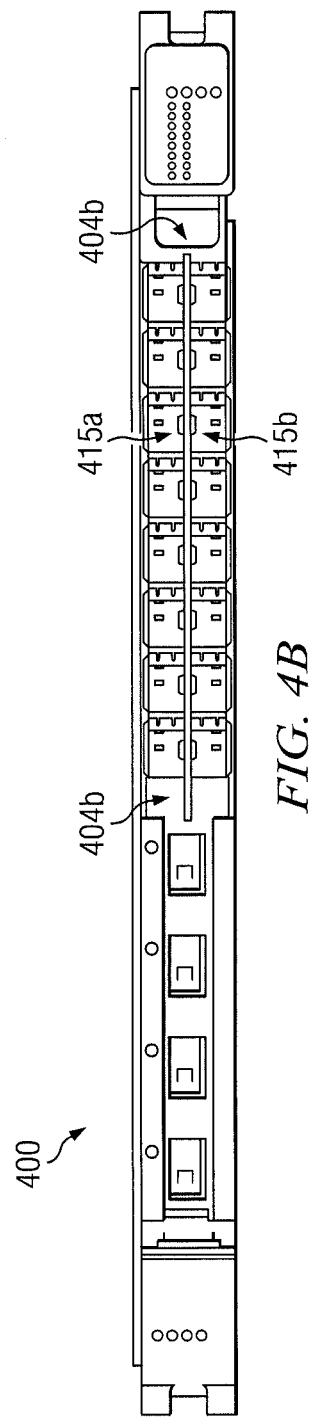
Figure 4C:
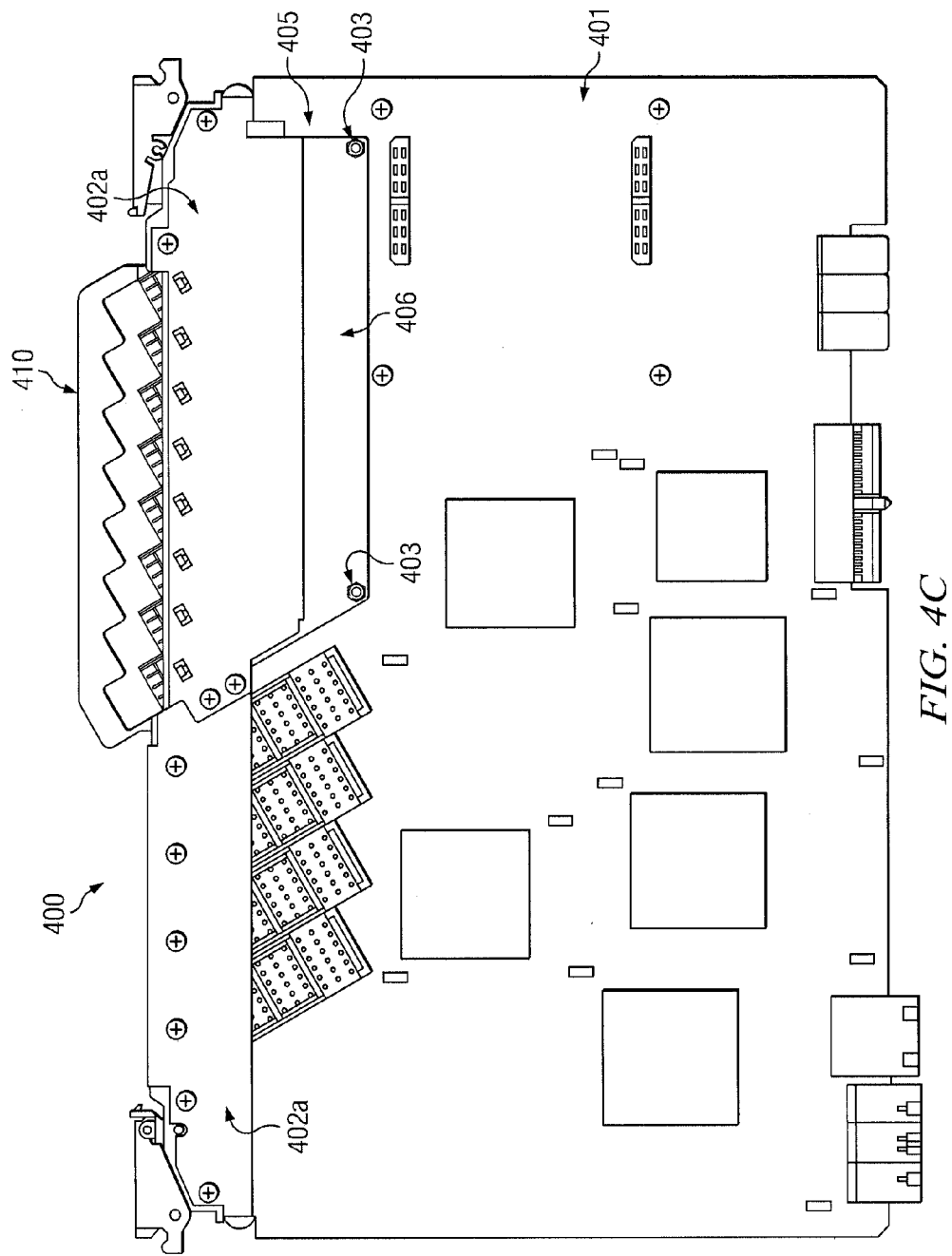

FIGS. 4A, 4B, and 4C are diagrams of an example embodiment of the present invention that illustrates a SFP module 405 and divider plate 410 installed on a circuit board 401 with a front panel frame assembly 402a and 402b.

FIG. 4A shows the back of an electronics assembly 400 with the SFP module 405 and divider plate 410 in an installed configuration. FIG. 4B shows an in-plane view of the electronics assembly 400 with the SFP module 405 and divider plate 410 installed, the divider plate being held in place with side panels 404a and 404b. FIG. 4C shows the front of the electronics assembly 400 with the SFP module 405 secured to the circuit board 401 with fasteners 403.

FIGS. 4A and 4C show the divider panel 410 protruding from the body of the electronics assembly 400. In general, communications equipment is installed in standardized modular equipment racks. Without close inspection, such standardization makes different types of equipment difficult to distinguish. As a technician is walking along a line of rack equipment, it is useful that he or she be able to identify quickly and easily a particular piece of equipment or a network connection targeted for repair or replacement. Because the divider panel 410 protrudes from the body of the electronics assembly 400, and therefore sticks out from the equipment rack, it facilitates identification of the electronics assembly 400, SFP module 405, SFP columns 415a and 415b, SFP transceivers 407, and SPF ports 420.

Figure 5:
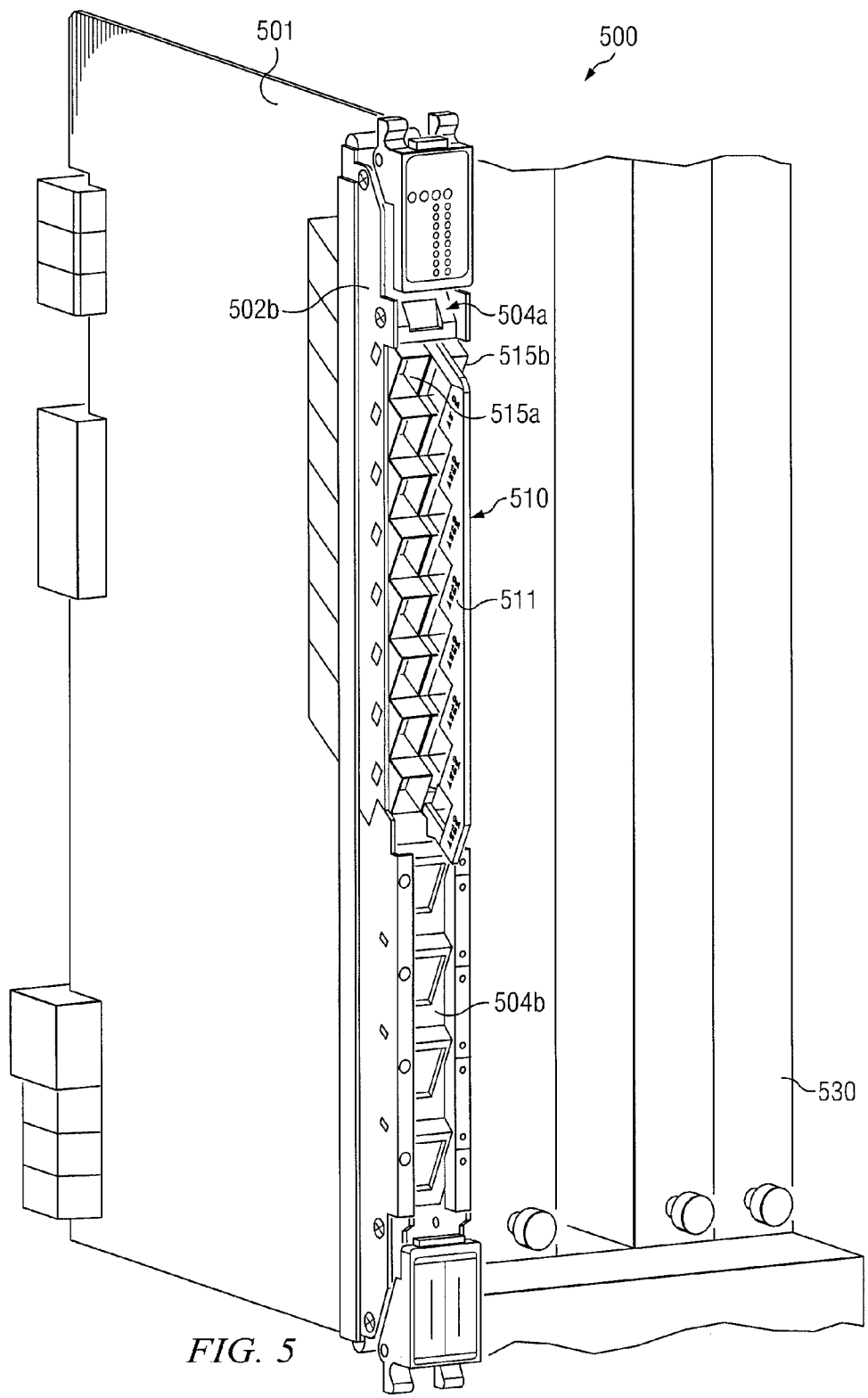
FIG. 5 illustrates a divider plated coupled between two columns of ports on a SFP module attached to a circuit board that is installed in a subrack, such as a subrack of a telecommunications equipment rack, according to an example embodiment of the present invention.

FIG. 5 illustrates a divider plate 510 coupled between two columns of ports 515a and 515b on a SFP module 505 attached to a circuit board 501 that is installed in a subrack 530, according to an example embodiment of the present invention. In this example embodiment of the present invention, the divider plate 510, with labels affixed 511, is installed in an electronics assembly 500. The divider plate is held between columns 515a and 515b of adjacent SFP ports 520 by side panels 504 that attach to the front panel frame assembly 502a and 502b of the electronic assembly 500.

Further, FIG. 5 illustrates an electronics assembly 500 partially installed in subrack 530. The partial installation helps reveal the details of the components of the electronics assembly 500, such as circuit board 501, frame 502a and 502b, side panel 504a and 504b, SFP columns 515a and 515b, SFP ports 505 and divider plate 510. Once the electronics assembly 500 is fully installed in subrack 530, the details of the components are no longer visible in typical system designs. However, because the divider plate 510 protrudes from the other subrack 530 equipment and provides a surface area for labels 511, the electronics assembly 500 is easily identifiable. As previously disclosed, the divider plate 510 provides the spacing necessary for a technician to manipulate individual SFP plugs manually, without disturbing neighboring SFP ports 220 and obviates the need for special tooling. Furthermore, the divider plate is useful to help ensure that the bend radius and physical layout of the cables connecting the various SFP ports 220 to other network elements maintain their integrities and the integrity of the optical and/or electromagnetic signals carried thereon.

While this invention has been particularly shown and described with references to example embodiments thereof, it will be understood by those skilled in the art that various changes in form and details may be made therein without deporting from the scope of the invention encompassed by the appended claims.

What is claimed is:

1. A small form factor pluggable (SFP) module comprising:
   a plurality of SFP ports arranged in adjacent columns with respect to a SFP module circuit board; and
   a divider plate spanning at least a length of the columns, the divider plate having first and second securing tabs extending from opposite ends of the divider plate, the first and second securing tabs enabling the divider plate to be coupled to the SFP module, a plane of the divider plate being parallel to a plane of the SFP module circuit board when coupled, the divider plate offset from the SFP module in a manner defining a gap between the divider plate and at least a subset of the SFP ports in the plane of the SFP module circuit board;
   wherein the SFP module includes a frame assembly spanning at least a portion of the length of the SFP module, the frame assembly having a first front panel above the plurality of SFP ports and a second front panel below the plurality of SFP ports, the divider plate being coupled to the front panel frame assembly of the SFP module by the first and second securing tabs' having contact with the first and second front panels.

2. The SFP module of claim 1 wherein the divider plate is adapted to be coupled to the SFP module via the SFP module circuit board.

3. The SFP module of claim 1 wherein the SFP ports of each column are arranged such that oblong sides of the SFP ports in an installed configuration in a first column are facing oblong sides of the SFP ports in an installed configuration in a second column.

4. The SFP module of claim 1 wherein the divider plate is arranged between the columns of SFP ports.

5. The SFP module of claim 1 wherein the divider plate is integral to the SFP module.

6. The SFP module of claim 1 wherein the divider plate is positioned between the columns of SFP ports in the SFP module when the SFP module is in an installed configuration.

7. The SFP module of claim 1 wherein the divider plate includes at least one surface configured to carry labels optionally identifying SFP ports.

8. The SFP module of claim 1 wherein the columns of SFP ports have a pitch from an SFP port in a first column to an adjacent SFP port in a second column that is less than or equal to 1.05 inches, and optionally equal to 1.00 inches.

9. The SFP module of claim 1 wherein the divider plate includes a repeating shape formed by a pattern at its periphery, each shape associated with a respective SFP port in a first column and a respective adjacent SFP port in a second column.

10. The SFP module of claim 1 wherein the divider plate includes shapes formed by its periphery, each shape associated with a respective SFP port in a first column and a respective adjacent SFP port in a second column.

11. A small form factor pluggable (SFP) module, comprising:
    SFP ports in adjacent columns on an SFP module circuit board;
    a frame assembly spanning at least a portion of a length of the SFP module, the frame assembly having a first front panel above the SFP ports and a second front panel below the SFP ports;
    means for dividing the adjacent columns in a manner defining a gap enabling access to the SFP ports from respective directions of the adjacent columns, wherein the dividing means has first and second securing means extending from opposite ends of the dividing means; and
    means for enabling coupling of the dividing means to the SFP module circuit board by securing first and second securing means with the first and second front panels.

* * * * *